(12) United States Patent
Zheng et al.

(10) Patent No.: US 6,913,680 B1
(45) Date of Patent: Jul. 5, 2005

(54) METHOD OF APPLICATION OF ELECTRICAL BIASING TO ENHANCE METAL DEPOSITION

(75) Inventors: Bo Zheng, San Jose, CA (US); Hougong Wang, Pleasanton, CA (US); Girish Dixit, San Jose, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 09/614,407

(22) Filed: Jul. 12, 2000

Related U.S. Application Data
(60) Provisional application No. 60/201,133, filed on May 2, 2000.

(51) Int. Cl.$^7$ ................................................ C25D 5/18
(52) U.S. Cl. ........................ 205/102; 205/103; 205/104; 205/105
(58) Field of Search .............................. 205/123, 102, 205/103, 104, 105; 11/18

(56) References Cited

U.S. PATENT DOCUMENTS

| | | | |
|---|---|---|---|
| 2,742,413 A | 4/1956 | Cransberg et al. | |
| 2,882,209 A | 4/1959 | Brown | |
| 3,627,661 A | 12/1971 | Gordon et al. | |

(Continued)

FOREIGN PATENT DOCUMENTS

| | | | |
|---|---|---|---|
| DE | 932 709 | 9/1955 | |
| EP | 1 050 902 | 11/2000 | ......... H01L/21/288 |
| EP | 1 160 846 | 12/2001 | |
| JP | 520 563 69 | 9/1977 | |
| JP | 58182823 | 10/1983 | ......... H01L/21/288 |
| JP | 61-7291 | 1/1986 | |
| JP | 63118093 | 5/1988 | ............ C25D/5/18 |
| JP | 04280993 | 10/1992 | ............ C25D/5/18 |
| JP | 6-17291 | 1/1994 | |
| JP | 4-141395 | 5/1994 | |
| SU | 443 108 | 11/1968 | |
| WO | WO 97/12079 | 4/1997 | ............ C25D/5/02 |
| WO | 99/25902 | 5/1999 | |
| WO | 99/25903 | 5/1999 | |
| WO | 99/25904 | 5/1999 | |
| WO | WO 99/25905 | 5/1999 | ............ C25D/5/02 |
| WO | 99/26275 | 5/1999 | |
| WO | WO-99/47731 | 9/1999 | |
| WO | WO 9954527 A2 | 10/1999 | ........... C25D/17/00 |
| WO | 99/54527 A2 | 10/1999 | |
| WO | WO 00/20662 | 4/2000 | ............ C25D/5/02 |
| WO | WO 00/22193 | 4/2000 | |
| WO | 01/90446 | 11/2001 | |

OTHER PUBLICATIONS

Holm, R., "Electric Contacts Theory and Application" Springer–Verlag New York Inc. 1967, 26 pages.
Pitney, K.E., "NEY Contact Manual," Electrical Contacts for Low Energy Uses, 1973, 19 pages. No Month Avail.
Singer, P., "Wafer Processing," Semiconductor International, Jun. 1998, 1 page.

(Continued)

*Primary Examiner*—Nam Nguyen
*Assistant Examiner*—Brian L. Mutschler
(74) *Attorney, Agent, or Firm*—Moser, Patterson & Sheridan (57) ABSTRACT

A method and associated apparatus includes depositing metal on a plating surface of an object immersed in an electrolyte solution prior to bulk deposition on the plating surface. In one aspect, the method further includes applying a voltage between an anode and the plating surface to enhance the concentration of metal ions in the electrolyte solution that is contained in a feature on the plating surface prior to the bulk deposition on the plating surface.

17 Claims, 7 Drawing Sheets

U.S. PATENT DOCUMENTS

| | | | | |
|---|---|---|---|---|
| 3,649,509 | A | 3/1972 | Morawetz et al. | |
| 3,727,620 | A | 4/1973 | Orr | |
| 3,770,598 | A | 11/1973 | Creutz | 204/52 R |
| 4,027,686 | A | 6/1977 | Shortes et al. | |
| 4,065,374 | A | 12/1977 | Asami et al. | |
| 4,092,176 | A | 5/1978 | Kozai et al. | |
| 4,110,176 | A | 8/1978 | Creutz et al. | |
| 4,113,492 | A | 9/1978 | Sato et al. | |
| 4,120,759 | A | 10/1978 | Asami et al. | |
| 4,129,480 | A | 12/1978 | Robert | |
| 4,315,059 | A | 2/1982 | Raistrick et al. | 429/112 |
| 4,326,940 | A | 4/1982 | Eckles et al. | |
| 4,336,114 | A | 6/1982 | Mayer et al. | |
| 4,376,685 | A | 3/1983 | Watson | |
| 4,396,467 | A | 8/1983 | Anthony | 204/15 |
| 4,405,416 | A | 9/1983 | Raistrick et al. | |
| 4,428,815 | A | 1/1984 | Powell et al. | |
| 4,435,266 | A | 3/1984 | Johnston | 204/276 |
| 4,489,740 | A | 12/1984 | Rattan et al. | |
| 4,496,436 | A | 1/1985 | Inoue | 204/23 |
| 4,510,176 | A | 4/1985 | Cuthbert et al. | 427/82 |
| 4,518,678 | A | 5/1985 | Allen | |
| 4,519,846 | A | 5/1985 | Aigo | |
| 4,693,805 | A | 9/1987 | Quazi | |
| 4,732,785 | A | 3/1988 | Brewer | |
| 4,789,445 | A | 12/1988 | Goffman et al. | |
| 4,869,971 | A | 9/1989 | Nee et al. | |
| 4,891,106 | A | 1/1990 | Domnikov | 205/159 |
| 4,898,647 | A | 2/1990 | Luce et al. | |
| 5,039,381 | A | 8/1991 | Mullarkey | 204/47.5 |
| 5,055,425 | A | 10/1991 | Leibovitz et al. | |
| 5,092,975 | A | 3/1992 | Yamamura et al. | |
| 5,155,336 | A | 10/1992 | Gronet et al. | |
| 5,162,260 | A | 11/1992 | Leibovitz et al. | |
| 5,178,813 | A | 1/1993 | Akatsu et al. | |
| 5,222,310 | A | 6/1993 | Thompson et al. | |
| 5,224,504 | A | 7/1993 | Thompson et al. | |
| 5,230,743 | A | 7/1993 | Thompson et al. | |
| 5,252,807 | A | 10/1993 | Chizinsky | |
| 5,256,274 | A | 10/1993 | Poris | 205/123 |
| 5,259,407 | A | 11/1993 | Tuchida et al. | |
| 5,290,361 | A | 3/1994 | Hayashida et al. | |
| 5,302,256 | A | 4/1994 | Miura et al. | |
| 5,316,974 | A | 5/1994 | Crank | |
| 5,328,589 | A | 7/1994 | Martin | |
| 5,349,978 | A | 9/1994 | Sago et al. | |
| 5,368,711 | A | 11/1994 | Poris | |
| 5,377,708 | A | 1/1995 | Bergman et al. | |
| 5,384,640 | A | 1/1995 | Wong | 356/437 |
| 5,415,890 | A | 5/1995 | Kloiber et al. | |
| 5,429,733 | A | 7/1995 | Ishida | 204/224 R |
| 5,447,615 | A | 9/1995 | Ishida | |
| 5,454,930 | A | 10/1995 | Miura et al. | |
| 5,456,819 | A * | 10/1995 | Lashmore et al. | 205/212 |
| 5,516,412 | A | 5/1996 | Andricacos et al. | |
| 5,516,414 | A | 5/1996 | Glafenhein et al. | |
| 5,528,118 | A | 6/1996 | Lee | |
| 5,608,943 | A | 3/1997 | Konishi et al. | |
| 5,625,170 | A | 4/1997 | Poris | |
| 5,651,865 | A | 7/1997 | Sellers | |
| 5,670,034 | A | 9/1997 | Lowery | |
| 5,705,223 | A | 1/1998 | Bunkofske | |
| 5,723,028 | A | 3/1998 | Poris | 204/231 |
| 5,730,890 | A | 3/1998 | Bickford et al. | |
| 5,838,121 | A | 11/1998 | Fairbairn et al. | |
| 5,882,498 | A | 3/1999 | Dubin et al. | 205/261 |
| 5,885,469 | A | 3/1999 | Kholodenko et al. | 216/11 |
| 5,972,192 | A | 10/1999 | Dubin et al. | 205/101 |
| 6,024,856 | A | 2/2000 | Haydu et al. | |
| 6,071,388 | A | 6/2000 | Uzoh | |
| 6,074,544 | A | 6/2000 | Reid et al. | 205/157 |
| 6,093,291 | A | 7/2000 | Izumi et al. | |
| 6,113,771 | A | 9/2000 | Landau et al. | |
| 6,133,061 | A | 10/2000 | Sonoda | |
| 6,162,344 | A | 12/2000 | Reid et al. | |
| 6,174,425 | B1 * | 1/2001 | Simpson et al. | 205/96 |
| 6,197,181 | B1 | 3/2001 | Chen | 205/123 |
| 6,203,582 | B1 | 3/2001 | Berner et al. | |
| 6,203,684 | B1 * | 3/2001 | Taylor et al. | 205/103 |
| 6,210,555 | B1 * | 4/2001 | Taylor et al. | 205/103 |
| 6,224,737 | B1 * | 5/2001 | Tsai et al. | 205/123 |
| 6,251,236 | B1 | 6/2001 | Stevens | 204/224 R |
| 6,254,760 | B1 | 7/2001 | Shen et al. | |
| 6,258,220 | B1 | 7/2001 | Dordi et al. | 204/198 |
| 6,261,433 | B1 | 7/2001 | Landau | 205/96 |
| 6,261,733 | B1 | 7/2001 | Coppens et al. | |
| 6,267,853 | B1 | 7/2001 | Dordi et al. | |
| 6,277,263 | B1 | 8/2001 | Chen | 205/182 |
| 6,290,833 | B1 | 9/2001 | Chen | 205/182 |
| 6,303,014 | B1 * | 10/2001 | Taylor et al. | 205/103 |
| 6,319,384 | B1 * | 11/2001 | Taylor et al. | 205/103 |
| 6,340,633 | B1 | 1/2002 | Lopatin et al. | 438/625 |
| 6,344,419 | B1 * | 2/2002 | Forster et al. | 438/758 |
| 6,350,366 | B1 | 2/2002 | Landau et al. | |
| 6,391,166 | B1 | 5/2002 | Wang | 204/224 |
| 6,395,101 | B1 | 5/2002 | Scranton et al. | |
| 6,399,479 | B1 | 6/2002 | Chen et al. | |
| 6,409,903 | B1 | 6/2002 | Chung et al. | 205/96 |
| 6,423,636 | B1 | 7/2002 | Dordi et al. | |
| 6,432,821 | B1 | 8/2002 | Dubin et al. | 438/678 |
| 6,432,832 | B1 | 8/2002 | Miller et al. | |
| 6,440,291 | B1 | 8/2002 | Henri et al. | 205/205 |
| 6,551,484 | B2 | 4/2003 | Hey et al. | |
| 6,551,488 | B1 | 4/2003 | Hey et al. | |
| 6,557,237 | B1 | 5/2003 | Olgado | |
| 6,565,729 | B2 | 5/2003 | Chen et al. | |
| 6,571,657 | B1 | 6/2003 | Olgado et al. | |
| 6,582,578 | B1 | 6/2003 | Dordi et al. | |
| 6,585,876 | B2 | 7/2003 | Dordi et al. | |
| 6,632,345 | B1 | 10/2003 | Chen | |
| 6,638,410 | B2 | 10/2003 | Chen et al. | |
| 6,662,673 | B1 | 12/2003 | Olgado | |
| 2001/0015321 | A1 | 8/2001 | Reid et al. | 205/103 |
| 2002/0011415 | A1 | 1/2002 | Hey et al. | |

OTHER PUBLICATIONS

Singer, P., "Tantalum, Copper and Damascene: The Future of Interconnects," Semiconductor International, Jun. 1998, 6 pages.

USSN 09/569,833 (Dordi, et al.), filed May 11, 2000.

European Search Report, EP Application No. 01303981.3, Oct. 22, 2003.

PCT Written Opinion; PCT US01/15200; Feb 5, 2004.

F. Lowenheim, Electroplating; McGraw–Hill Book Company, Jan. 8, 1979.

U.S. Appl. No. 09/614,407, Zheng, et al.

U.S. Appl. No. 09/569,833, Gandikota, et al.

Olgado, et al. "Stable Cell Platform," filed Sep. 29, 2000; USSN 09/676,362.

Dordi, et al. "Flow Diffuser to be Used in Electro–Chemical Plating System," filed Dec. 5, 2000; USSN 09/731,326.

Olgado, "Linear Motion Apparatus and Associated Method," filed Oct. 16, 2000; USSN 09/684,500.

Dordi, et al. "Method and Associated Apparatus for Tilting a Substrate Upon Entry for Metal Deposition," filed Oct. 3, 2000; USSN 09/678,947 (2601.P5).

Olgado, et al. "Multiple Blade Robot Adjustment Apparatus and Associated Method," filed Sep. 18, 2000; USSN 09/664,607 (2601.P3).

Olgado, "Removable Modular Cell for Electro–Chemical Plating," filed Sep. 15, 2000; USSN 09/663,814 (2601.P2).

Colombo, "Wafer Back Surfaces Film Removal," Central R&D, SGS–Thomson Microelectronics, Agate Italy.

International Search Report for PCT Application US01/15200 dated Mar. 11, 2003. (AMAT/4582.PC).

* cited by examiner

METHOD OF APPLICATION OF ELECTRICAL BIASING TO ENHANCE METAL DEPOSITION

PROVISIONAL APPLICATION INFORMATION

This application claims the benefit of U.S. Provisional Application No. 60/201,133 filed May 2, 2000, which is herein incorporated by reference.

BACKGROUND OF THE DISCLOSURE

1. Field of the Invention

The invention generally relates to deposition of a metal layer on a substrate. More particularly, the invention relates to electrical biasing between an anode and a substrate to enhance deposition of a metal layer on the substrate.

2. Description of the Background Art

Sub-quarter micron, multi-level metallization is an important process for the next generation of ultra large scale integration (ULSI). Reliable formation of interconnect features permits increased circuit density, improves acceptance of ULSI, and improves quality of individual processed substrates. As circuit densities have increased, the widths of vias, contacts and other features, as well as the width of the dielectric materials between the features, have decreased. However, the heights of the dielectric layers have not changed substantially over the same time frame. Therefore, the aspect ratios (i.e., the features height or depth divided by their width) of the minimum-width features have increased in recent years. Providing processing regimes to form these small features having an increased aspect ratio poses a challenge to traditional deposition techniques and processes. As a result, a great amount of ongoing effort is directed at the formation of void-free, nanometer-sized uniform ULSI features.

Electroplating, previously limited in integrated circuit design to the fabrication of lines on circuit boards, is now used to deposit metals, such as copper, to form interconnect features such as vias, trenches, and contacts. Metal electroplating, in general, can be achieved by a variety of techniques. A feature-fill process including electroplating involves initially depositing a diffusion barrier layer over the feature surfaces. Next, a seed layer 15 is deposited by a process such as physical vapor deposition (PVD) or chemical vapor deposition (CVD) on the feature surface. A metal layer is then deposited over the seed layer 15 by electroplating. Finally, the deposited layers can be planarized by another process, e.g., chemical mechanical polishing (CMP), to define a conductive interconnect feature.

Deposition of a metal layer by electroplating is accomplished by providing an electric current between the seed layer deposited on the substrate (cathode) and a separate anode. Both the anode and the cathode are immersed in an electrolyte solution containing the metal to be deposited. The chemical reaction between the anode and the electrolyte solution provides more metal ions into the electrolyte solution. A suitable electric voltage applied between the anode and the seed layer 15 on the substrate attracts the metal ions to the seed layer.

Figure 2A:
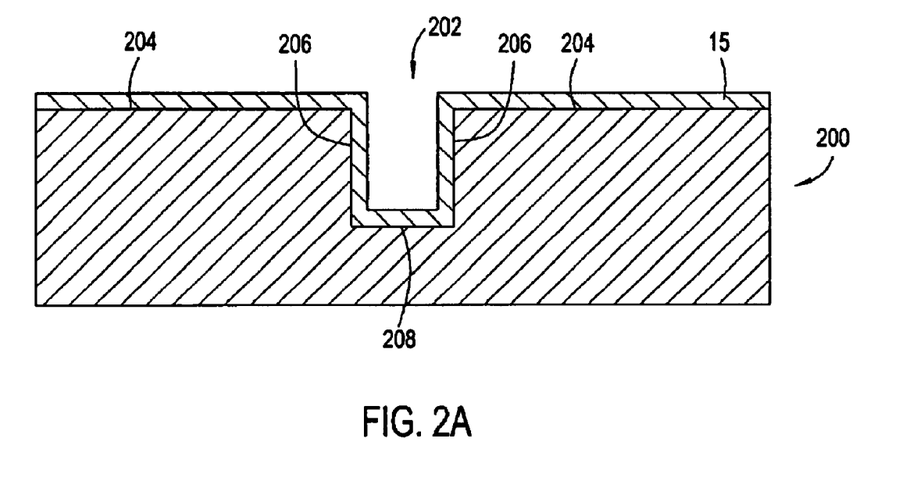
FIGS. 2A and 2B, shows a side cross sectional view of an object such as a semiconductor substrate including a via or trench, with the object undergoing a variety of metal deposition processes.

FIG. 2A shows a portion of a substrate 200 having a feature 202 formed therein. The feature 202 includes walls 206 and bottom 208. Outside of the feature is a horizontal surface 204. A throat 212 defines the opening of the feature 202 is formed between walls 206, on the opposed side of each features 202. The seed layer 15 is applied over the horizontal surface 204, the walls 206, and the bottom 208. Metal ions deposit on the seed layer 15. Non-uniformity in the deposited thickness of the metal layer on the walls 206 and the bottom 208 of the feature, and the horizontal surface 204 results because of minute sizes of the features, the different angular orientations of the different feature surfaces, and the increased charge density at the edges and corners of the features. Metal ions suspended in the electrolyte solution have difficulty entering the small feature due to the feature's small throat. The features have especially small entrance dimensions when the throat is closing off. Therefore, the concentrations of metal ions in the electrolyte solution within the features are lower than the concentration of metal ions in the electrolyte solution outside of the feature. This lower concentration of metal ions in the feature results in a lower deposition rate in the features.

A high deposition rate of the metal on the substrate during electroplating results in the substrates being plated faster, and thus processing the substrates at a rate that achieves higher throughput. When the seed layer 15 on the substrate is immersed in the electrolyte solution, a closed circuit is formed between the anode and the cathode. The deposition rate on a seed layer is a function of the bias current being applied from the anode to the seed layer 15. However, if too much electrical current is initially applied from the anode to the cathode, the deposited metal most rapidly forms at the throat of the feature. The deposited metal will likely close the throat of the feature before the inside of the feature is completely filled by deposited metal. The difficulty in depositing metal in the features before the throat is closed results from a difficulty in enhancing the concentration of metal ions in the electrolyte solution contained in the features of the substrate. Therefore, the initial bias deposition voltage applied to the seed layer 15 in electroplating systems is often limited to a value (approximately 0.8 volts) to provide relatively slow metal deposition that is sufficient to overcome the electrolyte solution etching away the seed layer 15 while not closing off the throat 212 of the feature. The level of the current/voltage between the anode and the plating surface controls the deposition rate in the horizontal surfaces 204 above and outside of the feature, as well as the walls 206 of the feature and the bottoms 208 of the feature.

Figure 2B:
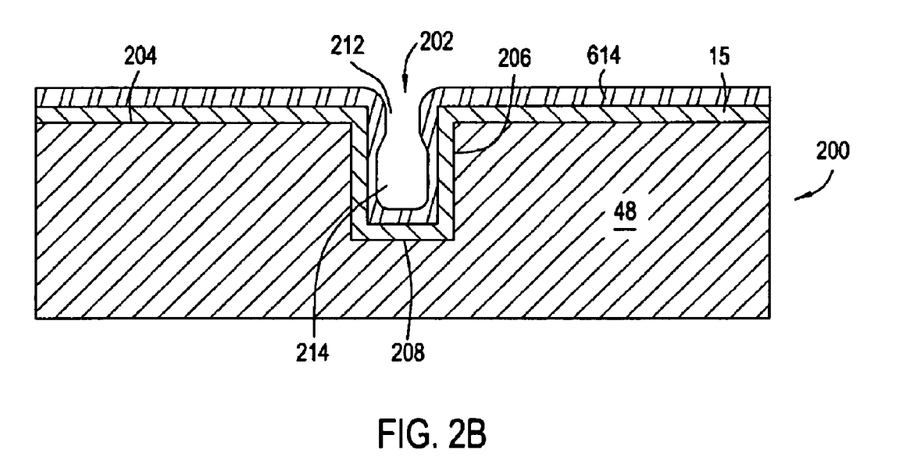

Care must be provided to limit closing of the throat 212 of the features during deposition as shown in FIG. 2B. If the throat 212 of the feature closes before the interior of the feature is filled with the deposited material, a void 214 is created within the feature 202. The integrity of an electronic device having voids formed therein is compromised.

Therefore, there is a need for an electroplating process that fills the feature before the bulk deposition of metal on the horizontal surface. Such an electroplating process would improve the deposition of metal ions within the feature during the initial metal ion deposition processes.

SUMMARY OF THE INVENTION

In one aspect, a method and associated apparatus is provided for depositing metal on a plating surface of an object immersed in an electrolyte solution prior to a bulk deposition on the horizontal surface of the plating surface. A voltage is applied from an anode to the plating surface to enhance the concentration of metal ions in the electrolyte solution contained in the features on the plating surface prior to the bulk deposition on the plating surface.

BRIEF DESCRIPTION OF THE DRAWINGS

The teachings of the present invention can be readily understood by considering the following detailed description in conjunction with the accompanying drawings, in which:

FIG. 2, comprising

FIG. 6, including

To facilitate understanding, identical reference numerals have been used, where possible, to designate identical elements that are common to the figures.

DETAILED DESCRIPTION

After considering the following description, the teachings of embodiments of the invention can be readily utilized in metal deposition applications. More particularly these teachings can be utilized in methods of biasing the voltage between an anode and a seed layer 15 on a semiconductor wafer (or another object that is configured as a cathode) in an electroplating deposition system. Such biasing of the voltage enhances the metal deposition in features formed in the substrate. One embodiment of an electroplating cell configuration is described. The application of electricity to a plating layer is then described.

Although a semiconductor wafer or substrate is disclosed herein as the object being electroplated, the concepts of the different embodiments of metal deposition system can be used to deposit metal on any seed layer on an object having features. The terms "metal" or "metal ions" as described herein is intended to mean any seed layer 15 form of material to be deposited on the substrate such as ions, atoms, or particles.

1. Electroplating Cell Configuration

The application of electricity to the plating layer and the associated deposition rates of metals on the seed layer are now described. In the following disclosure, the terms "plating current" and "deplating current" are used to describe those electrical currents resulting in current densities being applied to the plating surface of the seed layer that have a tendency to respectively enhance the plating action or enhance the deplating (etching) action on the seed layer. In this disclosure, the term "contact ring" describes the electrical contact(s) that supplies electricity to the seed layer. Other known types of contacts such as contact pins, contact pads, or contact rods may supply electricity to the seed layer.

Figure 1:
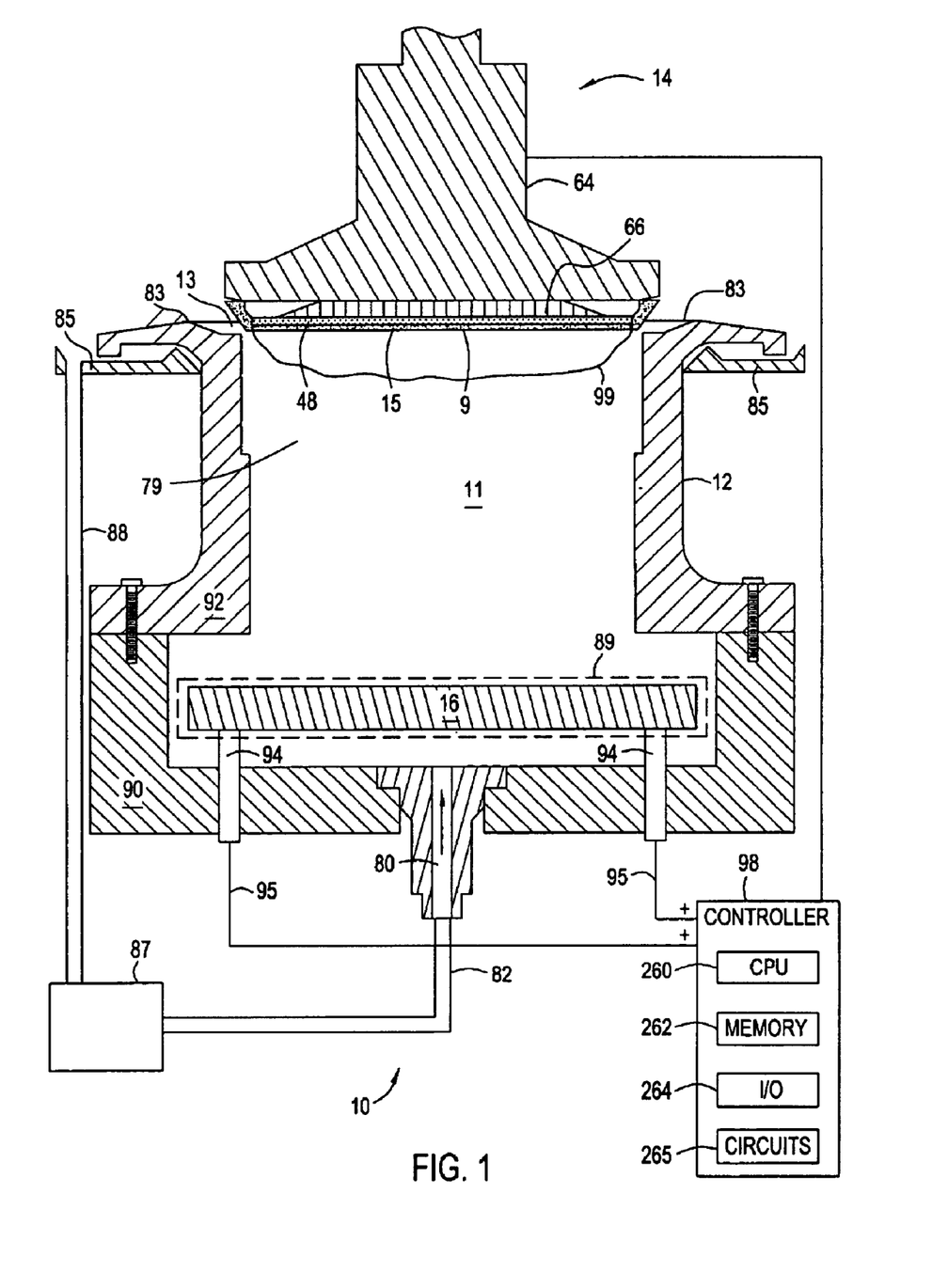
FIG. 1 shows a cross sectional view of an embodiment of electrochemical deposition system.

FIG. 1 illustrates one embodiment of electrochemical deposition (ECD) system 10 for electroplating metal on a seed layer 15 of a substrate 48. The ECD system 10 includes an electrolyte cell 12 having an upper opening 13, an anode 16 mounted in a bottom portion of the electrolyte cell 12, and a removable substrate holder 14 that secures a substrate so the substrate can be pivoted into, and out of, the electrolyte solution contained in the electrolyte cell. The substrate holder 14 includes a contact ring 9 and a thrust plate 66. Electrolyte solution is contained in the electrolyte cell such that when a seed layer formed on the substrate is contacting the electrolyte solution, the electrolyte solution forms an electrical bridge between the anode and the seed layer on the substrate. Electrical voltages are applied between the anode and the seed layer, resulting in an electrical current being established from the anode to the seed layer. The seed layer therefore acts as a cathode when properly electrically biased.

The electrolyte cell 12 comprises an anode base 90 and an upper cell member 92. The anode 16 is mounted to the anode base 90 by anode supports 94. The anode supports 94 are tubular in shape and surround a feed through 95, and the anode supports are preferably made from an elastomeric or plastic material. Feed throughs 95 are contained in the anode supports 94 that connect the anode 16 to the controller 98. A controller 98 controls the electrical power supplied to the anode. In one embodiment, a power supply with an external control can be used as a simplified controller 98. Alternatively, the sides of the anode may be mounted to the interior sides of the electrolyte cell 12. The upper cell member 92 is removably fastened to anode base 90 by fasteners.

The substrate holder 14 includes a head portion 64 that can hold a substrate immersed in the electrolyte solution contained in the ECD system 10. Certain embodiments of the head portion 64 are configured to rotate the substrate about the vertical axis of the substrate. Other embodiments of head portion 64 are configured to maintain the substrate without rotation.

The thrust plate 66 of the substrate holder 14 is displaced to a raised position when a robot is loading or unloading a substrate onto the contact ring 9 of the substrate holder. The surface of the substrate plated with the seed layer generally faces downward in ECD systems. Following insertion of the substrate onto the contact ring, the substrate lies on the contact ring such that the periphery of the seed layer 15 on the substrate electrically contacts the contact ring. The thrust plate 66 is then lowered firmly against the upper surface of the substrate to provide force between the seed layer 15 and the contact ring 9 to enhance the electrical contact. Electricity can therefore be applied from the controller 98 via the contact ring 9 to the seed layer 15 on the substrate. In certain embodiments, the contact ring, the thrust plate, and of the substrate 48 rotate as a unit to effect rotation of the substrate during the metal deposition process. In other embodiments, the contact ring, the thrust plate, and the substrate do not rotate as a unit during plating.

During the metal deposition process, a plating charge is applied from controller 98 via contact ring 9 to a seed layer deposited on a substrate 48. The plating charge causes the seed layer 15 formed on the substrate to perform as a cathode that is electrically coupled to the anode 16 by the electrolyte solution 79. The charged seed layer attracts metals that are contained within the electrolyte solution 79 within the vicinity of the seed layer (usually in the form of metal ions), thus providing metal deposition on the seed layer on the substrate.

The chemicals in the electrolyte solution contained in the electrolyte cell are maintained to ensure proper plating and/or etching. A hydrophilic membrane 89 surrounds the anode 16. Alternatively, the hydrophilic membrane could be mounted to extend horizontally across the electrolyte cell 12 above the substrate. The chemical reaction of the electrolyte solution with the anode results in the supply of metal ions into the electrolyte solution and a release of a material from the anode called anode sludge. The hydrophilic membrane 89 is selected to filter the anode sludge contained within the electrolyte solution, while permitting metal ions (for example copper, copper ions, or aluminum) supplied from the anode 16 to pass from the anode 16 to the cathode 48.

The electrolyte solution that is input from the input port 80 passes around the anode and may contact the upper surface of the anode. The electrolyte solution chemically reacts with anode 16 releasing the metal ions into the electrolyte solution. The electrolyte solution carries the metal ions provided by the anode 16 to the substrate 48. Some additional metal ions are contained in the electrolyte solution input through input port 80 that are also carried to the anode.

Electrolyte solution is supplied to electrolyte cell 12 via electrolyte input port 80. The displaced electrolyte solution in the electrolyte cell 12 flows over the annular weir portion 83 into an annular catch 85, that in turn drains into electrolyte output 88 that is fluidly coupled to a recirculation/refreshing system 87. The recirculation/refreshing system 87 refreshes the chemistry of the electrolyte solution to a level that is suitable for electroplating, then recirculates the electrolyte solution into the electrolyte cell 12. The refreshed electrolyte solution output from the recirculation/refreshing system 87 is applied to the inlet port 80 of the electrolyte cell 12 through an electrolyte input 82 to define a closed loop for the electrolyte solution, as now described.

Figure 5:
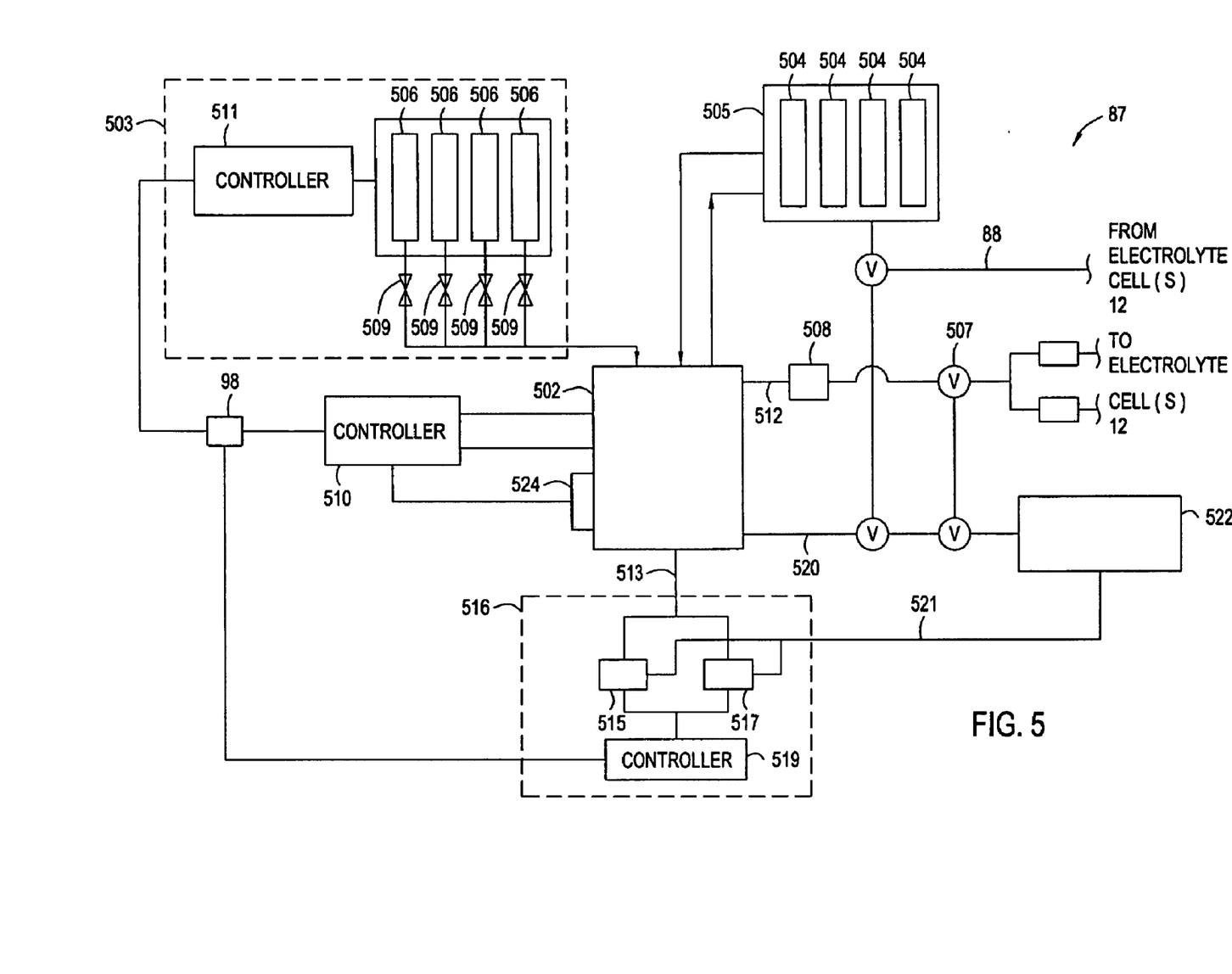
FIG. 5 is a schematic diagram of an embodiment of the recirculating/refreshing system shown in FIG. 1.

FIG. 5 is a schematic diagram of one embodiment of recirculation/refreshing system 87. The recirculation/refreshing system 87 generally comprises a main electrolyte tank 502, a dosing module 503, a filtration module 505, a chemical analyzer module 516, and an electrolyte waste disposal system 522 that are connected to the analyzing module 516 by an electrolyte waste drain 520. One or more controllers 510, 511, and 519 control the composition of the electrolyte in the main electrolyte tank 502 and the operation of the recirculation/refreshing system 87. Controllers 510, 511, and 519 may be independently operable but associated with the controller 98, or alternatively the controllers 510, 511, and 519 may be physically integrated in controller 98.

The main electrolyte tank 502 provides a reservoir for electrolyte and includes an electrolyte supply line 512 that is connected to electrolyte cell 12 through one or more fluid pumps 508, 530 and valves 507. A heat exchanger 524 or a heater/chiller disposed in thermal connection with the main tank 502 controls the temperature of the electrolyte stored in the main electrolyte tank 502. The heat exchanger 524 is connected to and operated by the controller 510.

The dosing module 503 is connected to the main electrolyte tank 502 by a supply line and includes a plurality of source tanks 506, or feed bottles, a plurality of valves 509, and the controller 511. The source tanks 506 contain the chemicals that are mixed to form the electrolyte solution. One embodiment of the source chemicals contained in the source tanks includes a de-ionized water source tank and copper sulfite source tank for composing the electrolyte. Other source tanks 506 may contain hydrogen sulfite, hydrochloric acid (HCl) and various additives such as glycol.

The deionized water source tank preferably also provides deionized water to the system for cleaning the system during maintenance. The valves 509 associated with each source tank 506 regulate the flow of chemicals to the main electrolyte tank 502 and may be any of numerous commercially available valves such as butterfly valves, throttle valves and the like. The controller 511 activates valves 509.

The electrolyte filtration module 505 includes a plurality of filter tanks 504. An electrolyte return line 88 is connected between each of the process cells and one or more filter tanks 504. The filter tanks 504 remove the undesired contents in the used electrolyte before returning the electrolyte to the main electrolyte tank 502 (the electrolyte cell 12) for re-use. The main electrolyte tank 502 is also connected to the filter tanks 504 to facilitate re-circulation and filtration of the electrolyte in the main electrolyte tank 502. By re-circulating the electrolyte solution from the main tank 502 through the filter tanks 504, the undesired contents in the electrolyte are continuously removed by the filter tanks 504 to maintain a consistent level of purity. Additionally, re-circulating the electrolyte between the main electrolyte tank 502 and the filtration module 505 allows the various chemicals in the electrolyte solution to be thoroughly mixed.

The recirculation/refreshing system 87 also includes a chemical analyzer module 516 that provides real-time chemical analysis of the chemical composition of the electrolyte. The analyzer module 516 is fluidly coupled to the main electrolyte tank 502 by a sample line 513 and to the waste disposal system 522 by an outlet line 521. The analyzer module 516 generally comprises at least one analyzer and the controller 519 to operate the analyzer. The number of analyzers required for a particular processing tool depends on the composition of the electrolyte. For example, while a first analyzer may be used to monitor the concentrations of organic substances, a second analyzer is needed for inorganic chemicals. In the specific embodiment shown in FIG. 5 the chemical analyzer module 516 comprises an auto titration analyzer 515 and a cyclic voltametric stripper (CVS) 517. Both analyzers are commercially available from various suppliers. An auto titration analyzer that may be used to advantage is available from Parker Systems and a cyclic voltametric stripper is available from ECI. The auto titration analyzer 515 determines the concentrations of inorganic substances such as copper, chloride, and acid. The CVS 517 determines the concentrations of organic substances such as the various additives that may be used in the electrolyte and by-products resulting from the processing which are returned to the main electrolyte tank 502 from the process cells.

In operation, a sample of electrolyte solution is flowed to the chemical analyzer module 516 via the sample line 513. Although the sample may be taken periodically, preferably a continuous flow of electrolyte solution is maintained to the chemical analyzer module 516. A portion of the sample is delivered to the auto titration analyzer 515 and a portion is delivered to the CVS 517 for the appropriate analysis. The controller 519 initiates command signals to operate the analyzers 515, 517 resulting in the generation of data. The information from the chemical analyzers 515, 517 is then communicated from the controller 519 to the controller 98. The controller 98 processes the information and transmits signals that include user-defined chemical dosage parameters to the dosing controller 511. The received information is used to provide real-time adjustments to the source chemical replenishment rates by operating one or more of the valves 509 thereby maintaining a desired, and preferably constant, chemical composition of the electrolyte solution throughout the electroplating process. The waste electrolyte from the analyzer module is then flowed to the electrolyte waste disposal system 522 via the outlet line 521.

The controller 98 shown in the embodiment of FIG. 1 controls electric voltage or current supplied to the anode 16 and the seed layer 15 on the substrate/cathode 48 as well as controlling the overall operation of the recirculation/refreshing system 87. The controller 98 comprises a central processing unit (CPU) 260, a memory 262, a circuit portion 265, an input output interface (I/O) 264, and a bus (not shown). The controller 98 may be a general-purpose computer, a microprocessor, a microcontroller, or any other known suitable type of computer or controller. The CPU 260 performs the processing and arithmetic operations for the controller 98, and controls the operation of the electricity applied to the anode 16, the seed layer 15 of the substrate 48, the operation of the substrate holder 14, and the operation of the recirculation/refreshing system 87.

The memory 262 includes random access memory (RAM) and read only memory (ROM) that together store the computer programs, operands, operators, dimensional values, system processing temperatures and configurations, and other parameters that control the electroplating operation. Bus (not shown) provides for digital information transmissions between CPU 260, circuit portion 265, memory 262, and I/O 264, and also connects I/O 264 to the portions of the electrolyte solution dispensing system 100 that either receive digital information from, or transmit digital information to, controller 98.

I/O 264 provides an interface to control the transmissions of digital information between each of the components in controller 98. I/O 264 also provides an interface between the components of the controller 98 and different portions of the electrolyte solution-dispensing system 100. Circuit portion 265 comprises all of the other user interface devices (such as display and keyboard), system devices, and other accessories associated with the controller 98. While one embodiment of digital controller 98 is described herein, other digital controllers as well as analog controllers could function well in this application, and are within the intended scope of the invention.

2. Electrical Application to Plating Layer

In one embodiment, the electrolyte solution is primarily formed from copper sulfite. The copper sulfite reacting with the anode produces the copper ions that are released at the anode. The copper ions that are released at the anode are deposited on the seed layer 15 of the substrate. In one embodiment, the anode comprises pure copper or a copper alloy. Alternatively, the anode can be formed of any metal to be deposited on the substrate. The electrochemical reaction between the anode and the electrolyte solution causes the pure copper to be released as ionic copper. At the seed layer 15 on the substrate, ionic copper is converted to atomic copper such that a thin film of atomic copper is deposited on the seed layer 15 during the deposition process.

An analysis is now performed to derive the deposition rates for two voltage biases established between the anode and the seed layer 15 on the substrate. The first voltage analyzed is a 0.8-volt bias that represents the initial voltage commonly applied in present systems between the anode and the seed layer on the substrate. The second voltage analyzed is a 5.0-volt bias that represents one embodiment of voltage applied between the anode and the seed layer on the substrate in one embodiment of the present invention. The other values (current, resistance, etc.) used in the analysis are identical. The following analysis indicates the effect that voltage has on deposition rate. The following equations assume a chemical etch rate of 1 Å/sec, and that the seed layer on the substrate is fully immersed in the electrolyte solution. In this disclosure, a current of 3.14 amps on a 200 mm diameter wafer provides a current density of 10 mA/cm². This 3.14 amp value would have to be adjusted for wafers of different diameters to maintain the 10 mA/cm² current density. For example, a 10 mA/cm² current density for a 300 mm wafer requires a 4.71 amp value.

For a bias of 0.8 volts between the anode and the seed layer on the substrate:
Using Ohms Law:

$$\frac{V_1}{V_2} = \frac{I_1 R}{I_2 R} \text{ or} \qquad \text{Equation (1)}$$

$$\frac{3.14A}{I} = \frac{2.9 \text{ Volts}}{0.8 \text{ Volts}} \qquad \text{Equation (2)}$$

Rearranging to derive 1 yields:

$$I = \frac{0.8 \times 3.14A}{2.9} = 0.87 \text{ amps} \qquad \text{Equation (3)}$$

The chemical etch rate on the cathode seed layer 15 is about 0.7 Å/sec and is not dependent on the voltage. In the embodiment of ECD system shown in FIG. 1, a current of 3.14 amps yielded a measured deposition rate of 36.7 Å/sec. Since the deposition rate is directly proportional to the current, the deposition rate with a 0.8 volt bias between the anode and the cathode yields:

$$\frac{3.14}{I_{0.8 volt}} = \frac{36.7}{x} \qquad \text{Equation (4)}$$

where x is the deposition rate. This equation for the deposition rate is applicable only when the substrate is completely immersed in the electrolyte solution. During the immersion of the substrate in the electrolyte solution, the voltage is constant at 0.8 volts, but the electric current ramps up depending largely upon the percentage of the seed layer 15 on the substrate that is immersed in the electrolyte solution. The deposition rate across the entire seed layer 15 also slowly increases proportionately with the ramping of the electric current. The above equation yields:

$$x = \frac{36.7 \times 0.87}{3.14} = 10.17 \text{ Å/sec} \qquad \text{Equaiton (5)}$$

Now, perform the same calculations using a 5-volt bias between the anode and the seed layer on the substrate:
Using Ohms Law:

$$\frac{V_1}{V_2} = \frac{I_1 R}{I_2 R} \qquad \text{Equation (6)}$$

As described above, a current of 3.14 amps corresponds to a current density of 10 mA/cm² for a 200 mm diameter wafer.

$$\frac{3.14A}{I} = \frac{2.9 \text{ Volts}}{5.0 \text{ Volts}} \qquad \text{Equation (7)}$$

rearranging the above terms to derive I yields:

$$I = \frac{5.0 \times 3.14A}{2.9} = 5.41 \text{ amps} \qquad \text{Equation (8)}$$

Using a 200 mm wafer in one embodiment of electroplating system, a current of 3.14 amps yields a measured deposition rate of 36.7 Å/sec. Since the deposition rate is directly proportional to the current, the deposition rate with a 5 volt bias between the anode and the cathode yields:

$$\frac{3.14}{I_{5.0 volts}} = \frac{36.7}{x} \qquad \text{Equation (9)}$$

where x is the deposition rate. This equation for the deposition rate is applicable only when the substrate is completely immersed in the electrolyte solution. During the immersion of the substrate in the electrolyte solution, the bias voltage is constant at 5 volts between the anode and the substrate seed layer, but the electric current is ramping. The ramping rate is a function of the amount of the substrate seed layer that is immersed in the electrolyte solution. The deposition rate also increases proportionately with the ramping up of the electric current. The above equation yields:

$$x = \frac{5.41 \times 36.7}{3.14} = 63.2 \text{ Å/sec} \qquad \text{Equation (10)}$$

Thus, altering the bias voltage from the anode to the substrate seed layer from a level of 0.8 volts to a level of 5 volts with the entire seed layer contained in the electrolyte solution increases the deposition rate from 10.17 Å/sec to 63.2 Å/sec as indicated by equations (5) and (10).

In a bottom-up deposition process generated by a bottom-up electric field in the electrolyte solution around a feature, the current density at the bottom 208 of a feature exceeds the current density of the horizontal surface 204 and the walls 206 of the feature. Therefore, with bottom-up deposition the deposition rate at the bottom 208 of the feature is higher than the deposition rate at the wall surface 206 of the feature. With bottom-up deposition, feature 202 will completely fill from the bottom up, yielding a feature substantially without voids. Following bottom-up deposition, further deposition on the metal layer of the horizontal surface 204 will increase the thickness of the horizontal surface 204 and above the filled feature 202. Filling the features with bottom-up deposition prior to the deposition processes (that apply the majority of the thickness of the metal to the horizontal surface 204) is desired.

Figure 3:
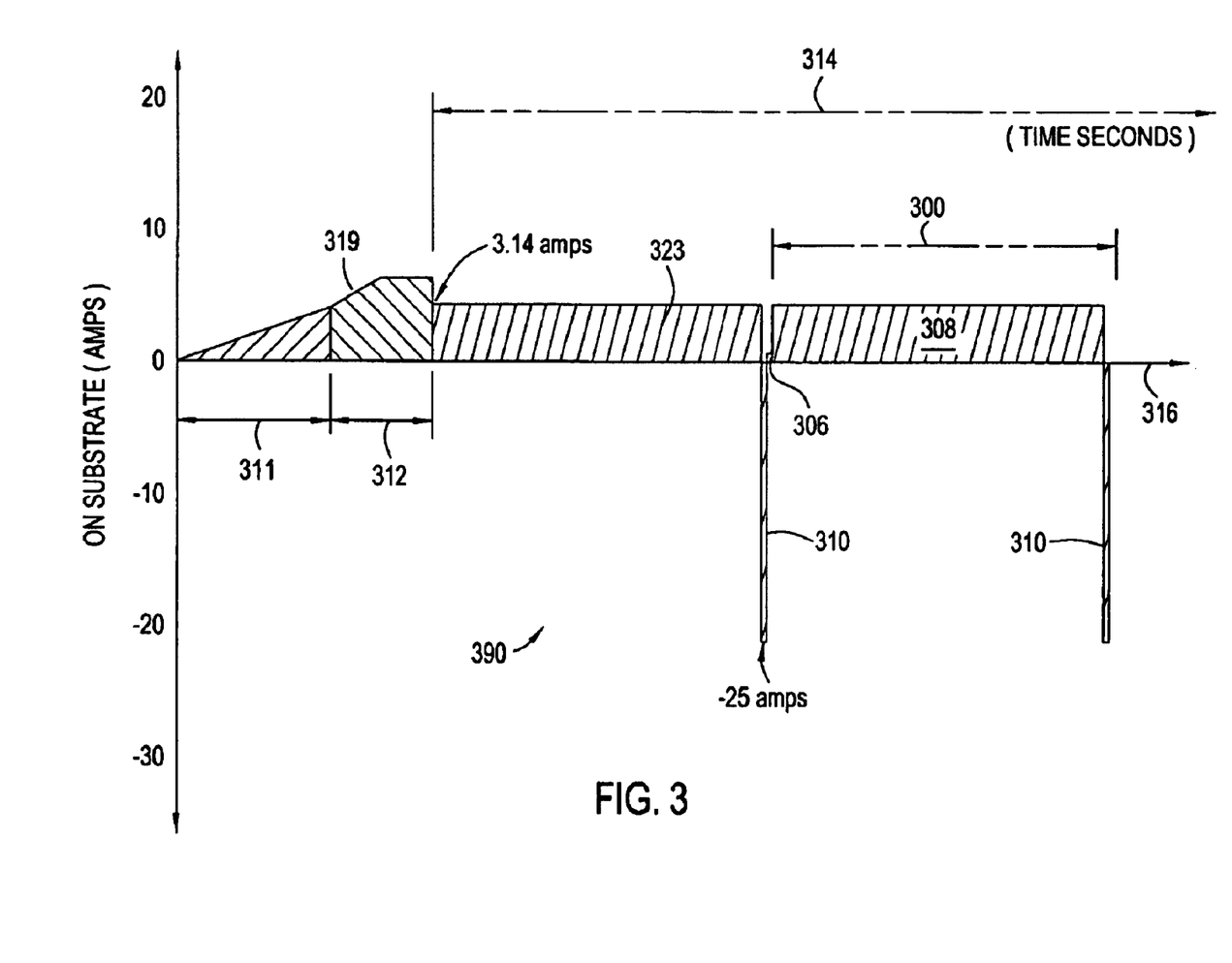
FIG. 3 shows one embodiment of a current vs. time graph of one embodiment of current versus time waveform to be applied to the substrate during steps 1, 2, and 3 of an electrochemical deposition process.

To vary the deposition rate in the seed layer, the current density applied across the face of the seed layer 15 is thus varied depending upon the type of processing that the substrate is undergoing. In one embodiment, a deposition method includes six steps (labeled step 1 to step 6) that an object such as a semiconductor substrate undergoes during a metal deposition process. The initial step is labeled step 1. Step 1 relates to the insertion of the substrate in the ECD system. Little metal is deposited on the substrate during step 1. The majority of metal deposition on the horizontal surface 204 of the seed layer 15 on the substrate occurs during steps 3 to 6 of the electroplating process, and is known as the "bulk deposition" portion of the electroplating process. Steps 1 to 6 are now each described sequentially in detail:

Step 1: To enhance the description of the current biasing between the anode and the seed layer 15 on the substrate, FIG. 3 is provided a graph 390 of one embodiment of the waveforms of steps 1 to 3 as respective current waveforms 311, 312, and 314, where the abscissa 316 represents time in arbitrary units and the ordinate 317 represents current in amps applied between the anode and the seed layer 15 on the substrate.

To assist in the description of the deposition on the seed layer, the FIG. 6 progression (including FIGS. 6A to 6F) is provided to show different stages of a metal deposited layer 614 forming on the seed layer 15. The seed layer 15 shown in FIGS. 2A, 2B, and 6A to 6F is described as separate from the metal deposited on the seed layer. The seed layer 15 and the subsequent deposited layer are typically formed from the same metal (for example copper), and a material-based boundary between the seed layer and the subsequent metal deposition does not exist. The seed layer 15 is shown as a separate layer from the subsequent metal deposition to indicate the depth of the metal deposition at different locations. FIG. 6A shows the seed layer 15 formed on walls 206, bottom 208, and horizontal surface 204. No metal deposition has formed on the seed layer in FIG. 6A. A process, such as PVD or CVD, applies the seed layer 15. The process is performed before the substrate is inserted in the ECD system.

The step 1 current 311 involves the electricity applied to the substrate 200 before and during the initial Immersion of the substrate into the electrolyte solution. During the immersion process represented as step 1, only a certain percentage of the seed layer 15 is immersed in the electrolyte solution. Many embodiments of substrate holders 14 "rotate" the substrate between 1 and 50 RPM as the substrate is immersed in the electrolyte solution. Since only a percentage of the substrate plating surface is immersed in the electrolyte solution, the plating current density level from the anode to the cathode is relatively low during step 1. The low deposition rate across all portions of the seed layer 15 during the immersion process is desired since otherwise, metal would be deposited only on those portions of the seed layer 15 on the substrate that have been instantaneously immersed in the electrolyte solution. Such metal deposition occurs on certain seed layer portions, but not others. Even brief immersion (with a considerable current density applied to the substrate) may lead to a non-uniform deposition across the surface of the seed layer. During step 1, the cathode/substrate seed layer is biased with a negative voltage relative to the anode ranging from about 1 to 5 volts to provide a slight plating current to the plating surface. This slight plating current limits etching of the seed layer 15 by the electrolyte solution that has a low pH (a low pH indicates the electrolyte solution is acid). Following the complete immersion of the substrate into the process position, step 2 is commenced. Step 1 is used to insert the substrate into the electrolyte solution with limited uneven deposition applied in combination with limited (or no) etching.

Step 2: This step involves attracting the metal ions in close proximity to the entire topography of the seed layer on the substrate including the portion of the seed layer covering the feature such that the metal can be deposited on the different portions of the seed layer 15 on the substrate (including within the feature), as described below. In FIG. 3, reference character 312 shows one embodiment of step 2 current. Step 2 is performed with the seed layer 15 of the substrate having a negative bias voltage ranging from 2 to 10 volts relative to the anode (one embodiment uses 5 volts). As indicated by the equation above, 5 volts applied between the seed layer and the anode results in an approximate plating direct current of 5.41 amps for a 200 mm diameter substrate. The 5.41 amp value applied for a substrate that is completely immersed in the electrolyte solution and the current has stabilized following ramping. The duration of step 1 is effected by the electric current ramping rate of the substrate being inserted into the electrolyte solution; Step 2 combined with step 1 typically lasts from ¼ to 2 seconds, and not more than 5 seconds.

Figure 6A:
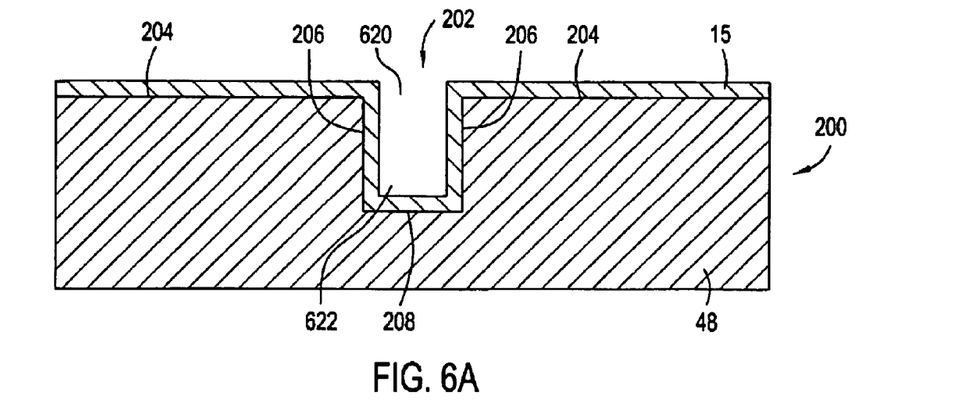
FIGS. 6A to 6F, shows a side view of a progression of depositing metal on a seed layer on a substrate.
Figure 6B:
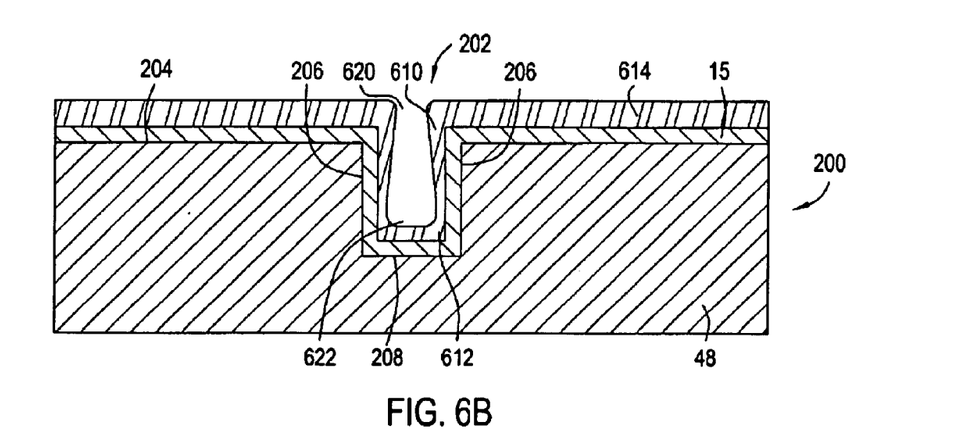

Metal ions contained in the electrolyte solution are deposited on the walls 206, bottom 208, and horizontal surface 204 as indicated by respective reference characters 610, 612, and 614 in FIG. 6B during step 2. The metal ions contained in the electrolyte solution are attracted to the vias or trenches in substantially similar, or even higher, concentrations than the metal ions adjacent the horizontal surfaces 204 of the substrate. Providing a higher bias voltage between the anode and the seed layer 15 on the substrate yields higher deposition rates at the walls 206, bottom 208, and horizontal surface 204 since the metal ions are attracted to this portion of the plated surface. Providing the step 2 feature-filling negative bias voltage (5 volts) of the substrate seed layer relative to the anode does not significantly affect the fluid boundary layer adjacent the substrate since voltage levels does not appreciably affect the fluid flow characteristics of the electrolyte solution. Providing a smooth fluid boundary layer (without eddies) provides optimum metal deposition characteristics because fluid turbulence disrupts metal deposition on substrates. The step 2 feature-filling voltage increases the concentration of metal ions in the electrolyte solution within the features because more metal ions are attracted to the vicinity of (and within) the features by the electric charge applied to the seed layer.

The 5-volt feature-filling step 2 bias between the anode and the seed layer 15 enhances the concentration of metal ions contained in the electrolyte solution that enter the feature. A depletion region 99 is created within the electrolyte solution that is located proximate the seed layer. The depletion region represents the volume in the electrolyte solution where the copper sulfite is dissociated into copper ions and sulfite ions. The positively charged copper ions are attracted to the substrate seed layer. The negatively charged sulfite ions from the charges for the depletion region, and are carried over the annular weir 83 to the recirculation/refreshing system 87. All other factors being consistent, a greater voltage between the anode and the substrate seed layer will result in a depletion region 99 having a larger size. The concentration of metal ions within the electrolyte solution contained in the features will approach and perhaps surpass the concentration of the metal ions in the electrolyte solution contained in the remainder of the electrolyte chamber 12. Therefore, the deposition rate of the metal on the bottom 208 of the features is similar to the deposition rate of the metal on those portions of the seed layer that are the horizontal surface 204. This enhanced deposition rate at the bottom of the feature results in the bottom-up deposition.

During the step 2 deposition, the electric current ramp 319 results since some finite time is required for the electric current applied to the substrate to reach its full step 2 level of electric current following immersion of the substrate in the electrolyte solution. The electric current ramping limits the amount of the full deposition rate that is performed during steps 1 and 2 (for example the 63 angstrom per second deposition rate described above relative to the current, voltage, and wafer size).

The electrolyte solution used in the bath has a low pH of approximately 0.8, meaning that the electrolyte solution is acidic. One of the major components of the electrolyte solution is hydrochloric acid that contributes largely to the acidity of the electrolyte solution. Without any electrical bias between the anode and the seed layer, the electrolyte solution will chemically etch the seed layer 15 on the substrate when the substrate is immersed in the electrolyte solution. This chemical etch rate of a seed layer on a substrate immersed in the electrolyte solution is independent of the voltage level of the seed layer 15 on the substrate. The chemical etch rate is not related to the electrochemical reaction associated with the metal deposition. Providing an electrical bias to the substrate that compensates for the low pH is important.

This step 2 feature-filling voltage is selected to be at a level that enhances the concentration of metal ions in the electrolyte solution. This voltage is also adequate to compensate for the chemical etching action of the electrolyte solution. The wall 206 and the bottom 208 often have a thinner metal deposition than the horizontal surface 204 as a result of previous processing such as PVD or CVD that was performed on the substrate before the substrate was sent to the ECD system. If an unbiased seed layer 15 of a substrate is immersed into an acidic electrolyte solution, a portion of the copper seed layer (most likely wall 206 at the bottom 208 within the feature) may become thinner or even discontinuous in a matter of seconds. Plating cannot proceed on any portion of the substrate without the seed layer formed on the substrate. Enough negative voltage is applied to the substrate seed layer relative to the anode to limit the copper seed layer (forming the seed layer 15) being etched by the electrolyte. As a result of the level of biasing and the plating current, the rate of metal deposition on the seed layer is above the rate of etching the deposited material on the seed layer. Additional components of the electrolyte solution may include a deposition enhancer (that enhances copper deposition rate onto the seed layer on the substrate), a brightener, and suppressors to enhance gap fill. A large plating current from the anode to the seed layer is not necessary to compensate for an etch rate, because the etch rate is actually relatively low (about 0.7 A per second). A 0.7 amp current provides a deposition rate of about 10 Å per second, for example.

The step 2 feature-filling bias results in high mobility of the copper ions contained in the electrolyte solution. If step 2 feature filling voltage is too high, the throats of the features will close before the feature is filled by deposited material (thereby creating voids in the features). Applying the step 2 feature filling voltage for too long will reduce the uniformity of the thickness of the deposited layer. The step 2 voltage thus acts to initially attract the copper ions in close proximity to, and deposit metal on, the entire topography (including the features) of the seed layer 15 on the substrate.

Step 3: This step involves an application of an initial plating current, as well as a pulse current waveform 300, to the seed layer 15 on the substrate. One embodiment of step 3 current is shown within pulsed region 314 in FIG. 3. In the pulse current waveform 300, positive plating currents from the anode to the seed layer on the substrate are alternated with negative de-plating currents. The plating currents deposit metals on the seed layer on the substrate, including within the features. The de-plating currents keep the throats of the features open until subsequent plating currents fill the features. Steps 1, 2, and 3 interact to fill the features formed in the seed layer on the substrate.

Following the application of the step 2 current, certain portions of the seed layer 15 on the substrate shown in FIG. 2A are typically thin as shown in FIG. 6B. For example, metal deposited on the horizontal surface 204 has a depth of about 200 to 2,500 Å while the metal deposited in the features has a depth of about 50 to 400 Å. An initial step 3 plating current 323 is therefore applied to build up the depth of the deposited layer 614 on the substrate at horizontal surfaces 204, the deposited layer 610 on the walls 206, and the deposited layer 612 on the bottom 208. The initial plating current 323 involves application of the same current as plating current 308 (that is applied for each pulse cycle 300), but extends 0 to 1.5 seconds longer than the plating current 308 for the non-initial pulse cycles 300. Initial plating current 323 is applied for a longer period than plating current 308 to increase the thickness of those portions of the seed layer that are most thin to limit the formation of discontinuities in the seed layer. The initial plating current is maintained at about 3.14 (but may range from 1.5 to 6.5) amps for a 200 mm diameter wafer for about 4 (but may range from 1 to 7) seconds.

Following this initial pulse plating current, the current of the pulse cycle 300 is pulsed for a number of times that is a function of the depth of the features. In an exemplary embodiment, the current is pulsed for about 15 times. Each pulse cycle 300 comprises a plating current 306 of from about 0.05 to 0.5 (preferably about 0.2) amps that lasts for from about 0.05 to 0.3 (preferably about 0.1) seconds, followed by a plating current 308 of about 1.5 to 6.5 (preferably about 3.14) amps for a 200 mm diameter wafer that lasts for about 1 to 5 seconds, and finally followed by a deplating current 310 of approximately −20 to −40 (preferably about −25) amps that lasts for about 0.05 to 0.2 (preferably about 0.1) seconds.

The plating current 306 redistributes the metal ions contained in the electrolyte solution such that the concentration of copper ions is enhanced within the electrolyte solution within the features. The plating current 308 provides deposition of the metal on the substrate, including the features. FIG. 6D shows metal depositions 610, 612, and 614 respectively on the wall 206, bottom 208, and the horizontal surface 204 following the positive plating current 308. In FIG. 6D, throat portion 620 is nearly, but not entirely, closed off.

Figure 6C:
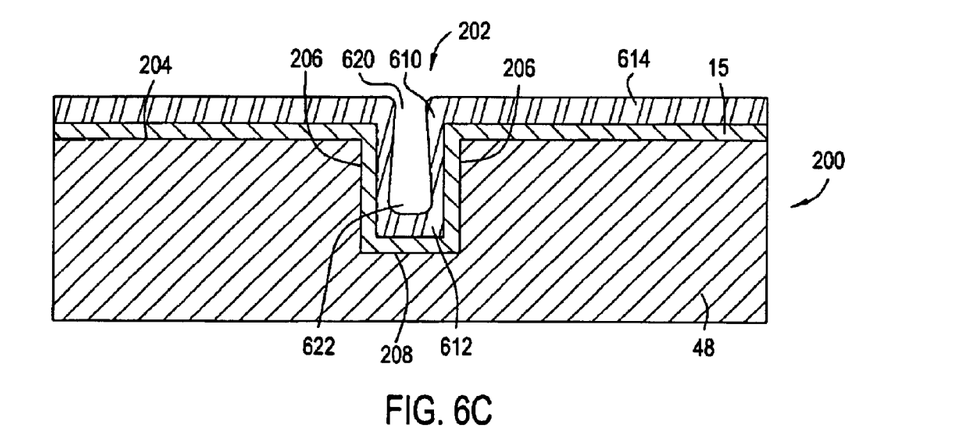
Figure 6D:
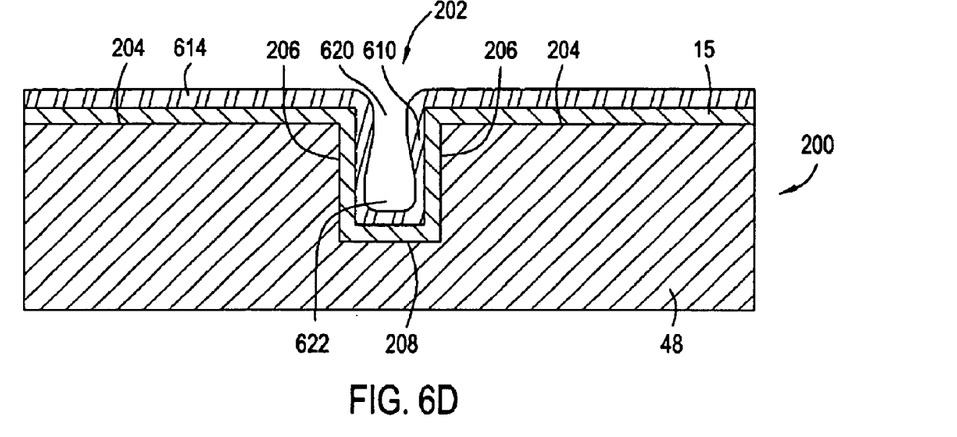

The metal depositions 610, 612, and 614 shown in FIG. 6C are each thickened following the initial pulse plating current 323 flowing from the anode to the seed layer. The thickened depositions limit damage to the seed layer 15 by subsequent etching processes.

Figure 6E:
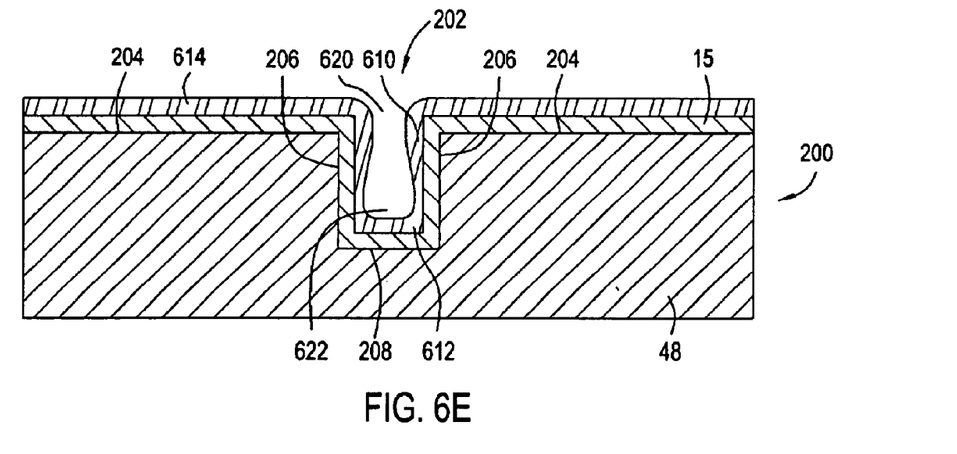

The deplating current 310 etches the portions of the depositions adjacent to the throats 620 of the features to keep the throats open. Keeping the throats 620 open allows continued deposition to limit the formation of voids within the features. FIG. 6E shows metal depositions 610, 612, and 614 respectively on the wall 206, bottom 208, and the horizontal surface 204 following the deplating current 310. The deplating current 310 etches away the metal depositions particularly at horizontal surface 614 and throat 620. The small dimension of throat 620 provides a constriction of the width of the opening into space 622, that limits the width (and amount) of the electrolyte solution contained at the throat. The limited amount of electrolyte solution at throat limits the electrical current that is conducted from the electrolyte solution contained in the electrolyte cell 12 to the electrolyte solution contained in the features. The constricted electrical current flowing into the electrolyte solution contained in the space 622 (during the de-plating current 310) limits the etching of the metal depositions 610 and 612 within the feature during the deplating current 310. During the plating current 308, metal deposits form within the wall 206, the bottom 208, and the horizontal surface 204.

Figure 6F:
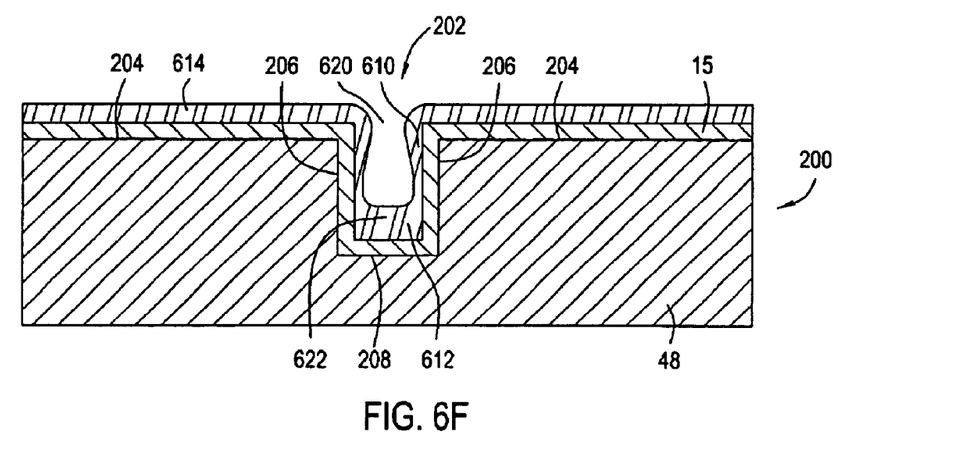

The alternating current waveform including the positive plating current 308, the negative deplating current 310, and the positive plating current 306 is alternated until the depth of metal deposition 612 rises to fill the space 622 as shown in FIG. 6F. Filling the space 622 from the bottom 208 is known as "bottom-up:deposition". This filling of the space 622 by deposited material thereby limits the creation of a void in the feature. During the application of the deplating current 310, copper is etched from the throats of the features more heavily than within the features as a result of the small horizontal area of the throat 620 defines a constriction and the amount of deplating currents flowing past the throats of the features to within the features are limited by this constriction. As the high current is applied to the substrate seed layer during the plating currents, copper ions still travel into the features (since the throats of the features are kept open by the deplating current 310) to fill space 622.

The deplating current 310 limits the formation voids in features, as indicated in FIG. 2B and 6D, in which the throat is closed off. The deplating current 310 is then applied to keep the throat of the feature open by etching the deposited layer most aggressively at the throat. The step 3 deposition/etching (dep-etch) waveform removes non-planar deposition surfaces resulting in bottom-up growth. The plating current and deplating current shown respectively as 308 and 310 in FIG. 3 can be used as the dep-etch-dep process. Preferably, the ratio of deposition to etch during each pulse cycle 300 is between about 1.5:1 and about 5:1. Following the cycling of the dep-etch waveforms of step 3 (resulting in the changes of the depths of the deposited layers 610, 612, and 614 shown in FIGS. 6C to 6F), the metal depth on the bottom 612 thickens until the space 622 is completely filled. The dep-etch-dep process is also useful for filling interconnect features.

Contact resistance is a measure of the electrical resistance between the contact ring 9 and the substrate seed layer. Filling the entire feature with copper results in a low contact resistance due to the good electrical characteristics of copper. Discontinuities such as gaps or voids that form in the seed layer 15 over one or more of the features may be detected following the deposition process by measuring an increased contact resistance of the substrate. This increased contact resistance is a result of the decreased resistance of discontinuities (that include air) compared with filled features that contain copper. Following step 2 is a good time to measure contact resistance since any discontinuity in the seed layer 15 should be patched to make certain that the seed layer is continuous. Such patching should occur before a substrate undergoes steps 3–6, as described below. Any surface that does not have a seed layer cannot be plated. An additional deposition process such as can patch seed layer discontinuities described in step 3.

Steps 4, 5, and 6:

Following step 3, steps 4, 5 and 6 combine to provide deposition across both the horizontal surface 204 and above those features that were filled as described in step 3. Step 3 pulse waveform is most effective at filling features having a smaller thickness. Certain features having a thicker width than shown will not be filled by the step 3 waveform. Therefore, the bulk deposition applied in steps 4, 5, and 6 cover both the metal deposited in the filled smaller sized features and the horizontal surfaces 204. The bulk deposition process described in steps 4–6 also fills those larger dimensioned features that remain unfilled following step 3. During steps 4, 5, and 6, the features remain filled because of the DC and pulsed currents applied during steps 1 to 3, described above. The electroplating that occurs during steps 4, 5 and 6 are referred to as "bulk deposition" between the anode and the seed layer 15 on the substrate. The term "bulk deposition" is appropriate since these steps represent when the greatest depth of metal is deposited to the horizontal surfaces 204.

The thickness of the deposition layer on the horizontal surface is a design choice depending upon the intended use of the object, the electronic characteristics, and the designer's criterion and choices. As such, a wide variety of bulk deposition waveforms may be applied while remaining within the scope of the present invention. Common thicknesses of the deposited layer resulting from the bulk deposition range from 1.0μ to 3.0μ. Step 4 may last from about 1 to 120 seconds in which a current density of about 10 mAmps/cm² is applied to the object. In steps 5 and 6, the current level from the anode to the cathode is raised from the level in the previous step to increase the deposition rate. For example, step 5 may include a current density of about 40 mAmps/cm² may be applied to the seed layer 15 from about 1 to 120 seconds. Step 6 may last from about 1 to 120 seconds in which a current density of about 60 mA/cm² is applied to the seed layer. Steps 4, 5 and 6 represent an illustrative bulk deposition waveform, and are not limiting as the only waveform that may be used following the steps 1 to 3 waveform.

The metal deposition in steps 4, 5 and 6 does not affect the deposition on the walls or the bottom of the features since the features are already filled in steps 1 to 3. The application of the steps 4, 5, and 6 current does not significantly effect the production of the fluid boundary layer that enhances the deposition process since the application of voltage occurs substantially independently of the fluid flow of the electrolyte solution that affects the boundary layer. Though one embodiment of current density waveform has been briefly set forth in this steps 4, 5, and 6 description, any suitable known plating current and technology can be applied to provide the desired depth of deposition layer on the horizontal surface.

3. Controller Operation

Figure 4:
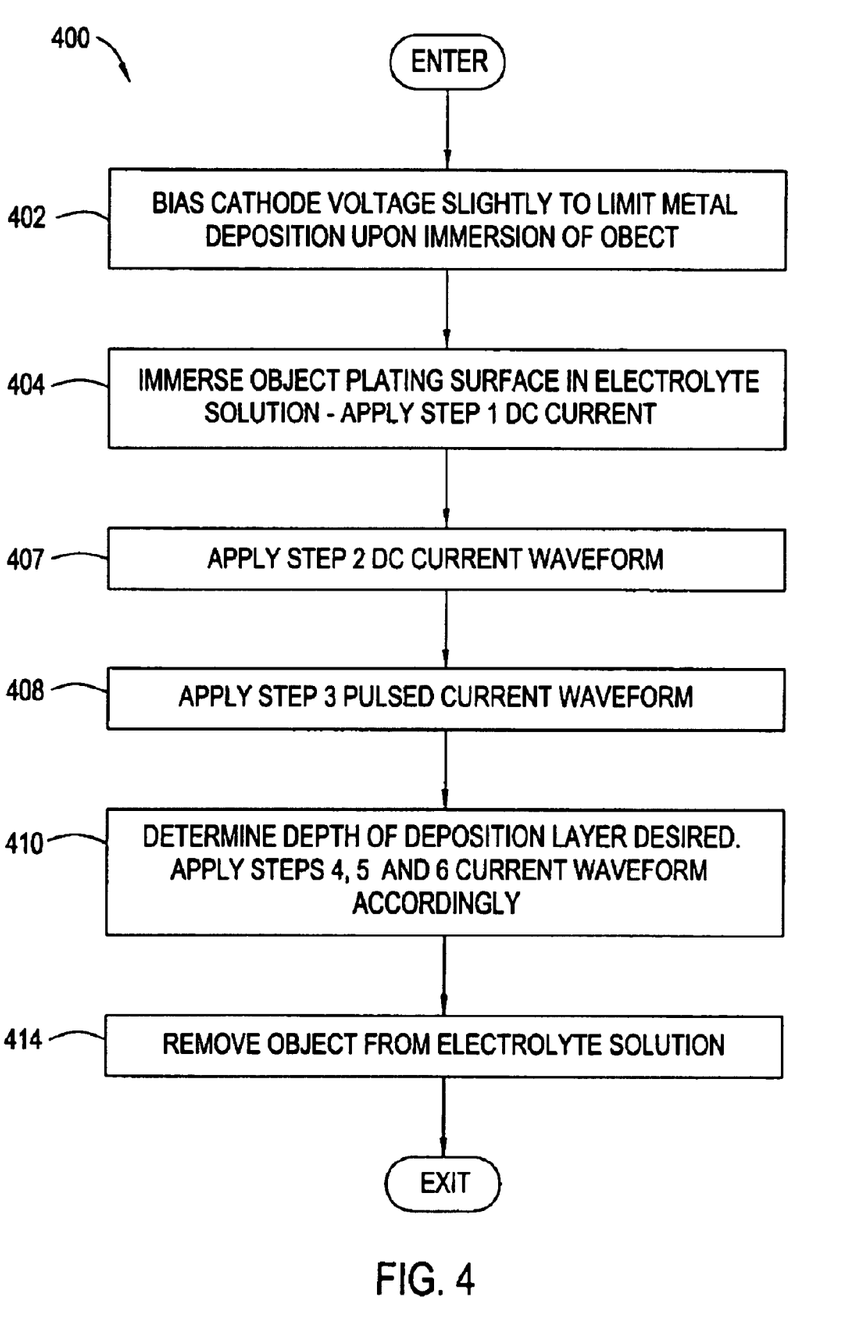
FIG. 4 shows one embodiment of method to deposit metal on a seed layer on a substrate.

FIG. 4 shows one embodiment of method 400 performed by controller 98 in depositing metals on the seed layer on the substrate. The method 400 starts with block 402, in which prior to the immersing of the substrate in the electrolyte solution, the bias applied between the anode and the cathode is negligible since the electrolyte cell defines an open circuit. This open circuit exists since the cathode (wafer) is removed from (and does not electrically contact) the electrolyte solution. There is therefore no medium to carry electrical current between the anode and the cathode to form an electrical path. Method 400 continues to block 404 in which the seed layer 15 on the substrate is immersed into the electrolyte solution. During this immersion, the deposition on the seed layers is limited due to the limited surface area of the substrate exposed to the electrolyte solution. During the immersion, a closed circuit is incrementally created between the anode and the seed layer on the substrate. Block 404 may be viewed as the application of the step 1 DC current, as described above.

The method 400 continues to block 407 in which the step 2 DC current waveform is applied. The step 1 current/voltage combined with the step 2 voltage/current typically is applied for a total duration of from one to two seconds. During the step voltage/current, increasing the concentration of the metals contained in the electrolyte solution within the features compared with the concentration of the metals contained in the electrolyte solution adjacent the horizontal surface is desired. The deposition rate inside the feature will therefore equal (or exceed) the deposition rate on the horizontal surface of the seed layer outside of the feature to provide bottom-up deposition. The bottom-up deposition fills the features more completely than other known feature filling techniques.

The method 400 then continues to block 408 in which, the controller 98 applies the pulsed waveform voltage as outlined in the description to step 3 above.

The method 400 then continues to block 410 in which the controller (upon receipt of the desired depth of the deposition layer on the horizontal surface 204) applies a DC current between the anode and the cathode for a desired period. The period of deposition depends upon the desired depth of the deposition layer. The longer the steps 4, 5, and 6 DC currents are applied, the greater will be the deposited layer of metal on the horizontal surface 204.

Following block 410, the method 400 continues to block 414 in which the object is removed from the electrolyte solution. Such removal of the substrate from the electrolyte solution results in an open electrical circuit being created between the anode and the cathode, since there is no electrical conductive path between the anode and the cathode. If further substrates are to be processed in the ECD system 10, then the method 400 is repeated on the subsequent substrates. The controller 98 can accept input from the operator indicating how to process each substrate, or process each substrate in an identical, repetitive manner.

Although various embodiments that incorporate the teachings of the present invention have been shown and described in detail herein, those skilled in the art can readily devise many other varied embodiments that still incorporate these teachings.

What is claimed is:

1. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a current that increases over time as the substrate is introduced into the electrolyte solution; and applying a plating voltage to the substrate once the substrate has be en immersed into the electrolyte solution.

2. The method of claim 1, wherein the current is a ramping current.

3. The method of claim 1, wherein the first biasing voltage is about 0.8 volts.

4. The method of claim 1, wherein the first biasing voltage is configured to limit etching by the electrolyte solution of a seed layer disposed on the one or more features formed on the substrate as the substrate is being immersed into the electrolyte solution.

5. The method of claim 1, wherein the first biasing voltage ranges from about 1 volt to about 5 volts.

6. The method of claim 1, wherein the electrolyte solution is acidic.

7. The method of claim 1, wherein applying the plating voltage step comprises applying a pulsed biasing voltage to the substrate.

8. The method of claim 1, wherein the first biasing voltage is negative relative to the anode.

9. The method of claim 1, wherein the current increases as the percentage of substrate immersed into the electrolyte solution increases.

10. The method of claim 1, wherein the first biasing voltage comprises a negative voltage that is calculated to limit etching of a seed layer formed on the substrate by the electrolyte solution.

11. The method of claim 1, wherein the first biasing voltage comprises a negative voltage configured to deposit metal onto the substrate at a first deposition rate, the first deposition rate being greater than an etching rate of the electrolyte solution.

12. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a current that increases over time; and applying a positive plating current alternated with a negative de-plating current, the positive plating current being configured to cause deposition of metal inside the features, the negative de-plating current being configured to keep each opening of the features open while the metal is being deposited inside the features by the positive plating current.

13. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a current that increases over time;

applying a second biasing voltage to the substrate after applying the first biasing voltage, the second biasing voltage being configured to attract metal ions contained in the electrolyte solution near the features; and applying a plating voltage to the substrate once the substrate has been immersed into the electrolyte solution.

14. The method of claim 13, wherein the first biasing voltage and the second biasing voltage are applied for about 0.25 seconds to about 5 seconds.

15. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a current that increases over time;

applying a plating voltage to the substrate once the substrate has been immersed into the electrolyte solution; and applying a second biasing voltage to the substrate after applying the first biasing voltage but prior to applying the plating voltage, wherein the second biasing voltage is configured to attract metal ions contained in the electrolyte solution near the features and wherein the second biasing voltage is higher than the plating voltage.

16. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a ramping current; and applying a pulsed biasing voltage to the substrate once the substrate has been immersed into the electrolyte solution.

17. A method of depositing a metal on a substrate having one or more features formed thereon, comprising:

applying a first biasing voltage to the substrate while immersing the substrate into an electrolyte solution contained in an electrolyte container comprising an anode immersed in the electrolyte solution, wherein the first biasing voltage is configured to generate a ramping current; and applying a positive plating current alternated with a negative de-plating current, the positive plating current being configured to cause deposition of metal inside the features, the negative de-plating current being configured to keep each opening of the features open while the metal is being deposited inside the features by the positive plating current.

\* \* \* \* \*

UNITED STATES PATENT AND TRADEMARK OFFICE
CERTIFICATE OF CORRECTION

PATENT NO. : 6,913,680 B1
APPLICATION NO. : 09/614407
DATED : July 5, 2005
INVENTOR(S) : Bo Zheng et al.

It is certified that error appears in the above-identified patent and that said Letters Patent is hereby corrected as shown below:

Column 5, Line 52: Change "HCI" to --HCl--

Column 8, Line 12: After "derive", change "1" to --I--

Column 8, Line 25 (Equation 4): Change $I_{0.8voh}$" to --$I_{0.8volt}$--

Column 10, Line 17: Change "Immersion" to --immersion--

Column 12, Line 29: After "0.7", change "A" to --Å--

Column 15, Line 63: Change the comma after "which" to a space

In the Claims

Column 16, Claim 1, Line 36: Change "be en" to --been--

Signed and Sealed this

Third Day of October, 2006

JON W. DUDAS
*Director of the United States Patent and Trademark Office*